(12) United States Patent
Zhang et al.

(10) Patent No.: US 12,232,343 B2
(45) Date of Patent: Feb. 18, 2025

(54) ORGANIC LIGHT EMITTING DEVICE, PREPARATION METHOD THEREFOR, AND DISPLAY APPARATUS

(71) Applicant: BOE Technology Group Co., Ltd., Beijing (CN)

(72) Inventors: Zhihui Zhang, Beijing (CN); Yan Fan, Beijing (CN); Xing Fan, Beijing (CN); Shu Jing, Beijing (CN); Huameng Liu, Beijing (CN); Kuo Shen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/638,195

(22) PCT Filed: Apr. 26, 2021

(86) PCT No.: PCT/CN2021/089833
§ 371 (c)(1),
(2) Date: Feb. 25, 2022

(87) PCT Pub. No.: WO2022/226718
PCT Pub. Date: Nov. 3, 2022

(65) Prior Publication Data
US 2024/0057363 A1    Feb. 15, 2024

(51) Int. Cl.
*H01L 51/50* (2006.01)
*H10K 50/11* (2023.01)
(Continued)

(52) U.S. Cl.
CPC ............. *H10K 50/11* (2023.02); *H10K 50/16* (2023.02); *H10K 50/858* (2023.02); *H10K 71/12* (2023.02);
(Continued)

(58) Field of Classification Search
None
See application file for complete search history.

(56) References Cited

U.S. PATENT DOCUMENTS

| | | |
|---|---|---|
| 2012/0199837 A1 | 8/2012 | Kobayashi et al. |
| 2013/0285027 A1 | 10/2013 | Loebl et al. |

(Continued)

FOREIGN PATENT DOCUMENTS

| | | |
|---|---|---|
| CN | 103180993 A | 6/2013 |
| CN | 103762318 A | 4/2014 |

(Continued)

*Primary Examiner* — Anthony Ho
(74) *Attorney, Agent, or Firm* — Ling Wu; Stephen Yang; Ling and Yang Intellectual Property

(57) ABSTRACT

An organic light emitting device, a preparation method therefor, and a display apparatus are provided. The organic light emitting device includes an anode, a cathode, and a light emitting layer and an electron transport layer arranged between the anode and the cathode. The electron transport layer is arranged between the light emitting layer and the cathode. The electron transport layer includes a first host material and a second host material. A mixing ratio of the first host material to the second host material of one side of the electron transport layer close to the light emitting layer is different from a mixing ratio of the first host material to the second host material of one side of the electron transport layer away from the light emitting layer.

18 Claims, 5 Drawing Sheets

(51) Int. Cl.
   *H10K 50/16*   (2023.01)
   *H10K 50/858*  (2023.01)
   *H10K 71/12*   (2023.01)
   *H10K 101/00*  (2023.01)
   *H10K 102/00*  (2023.01)

(52) U.S. Cl.
   CPC ... *H10K 2101/90* (2023.02); *H10K 2102/351* (2023.02)

(56) References Cited

U.S. PATENT DOCUMENTS

| | | |
|---|---|---|
| 2017/0098782 A1 | 4/2017 | Choi et al. |
| 2017/0309861 A1 | 10/2017 | Wang et al. |
| 2018/0269419 A1 | 9/2018 | Tu et al. |
| 2018/0337352 A1 | 11/2018 | Furno et al. |
| 2019/0363270 A1 | 11/2019 | Wang et al. |
| 2019/0372044 A1 | 12/2019 | Qiao et al. |
| 2022/0098479 A1 | 3/2022 | Mei et al. |

FOREIGN PATENT DOCUMENTS

| | | |
|---|---|---|
| CN | 103779501 A | 5/2014 |
| CN | 104064690 A | 9/2014 |
| CN | 105702876 A | 6/2016 |
| CN | 106560935 A | 4/2017 |
| CN | 106601932 A | 4/2017 |
| CN | 106784355 A | 5/2017 |
| CN | 108134012 A | 6/2018 |
| CN | 108539034 A | 9/2018 |
| CN | 108933197 A | 12/2018 |
| CN | 112151689 A | 12/2020 |
| JP | 20090212235 A | 9/2009 |

ORGANIC LIGHT EMITTING DEVICE, PREPARATION METHOD THEREFOR, AND DISPLAY APPARATUS

CROSS-REFERENCE TO RELATED APPLICATION

The present application is a U.S. National Phase Entry of International Application PCT/CN2021/089833 having an international filing date of Apr. 26, 2021. The entire contents of the above-identified application are hereby incorporated by reference.

TECHNICAL FIELD

The present disclosure relates to, but is not limited to, the field of display technology, and in particular to an organic light emitting device, a method for preparing the organic light emitting device, and a display apparatus.

BACKGROUND

An Organic Light Emitting Diode (OLED for short) is an active light emitting device having advantages such as light emission, ultra-thinness, wide viewing angle, high brightness, high contrast, low power consumption, extremely high response speed, etc., which has gradually become the next generation display technology with great development prospects. With continuous development of the display technology, a display apparatus that uses an OLED as a light emitting device and uses a Thin Film Transistor (TFT for short) for signal control has become a mainstream product in the field of display at present.

An OLED includes an anode, a cathode, and a light emitting layer arranged between the anode and the cathode. A light emitting principle of the OLED is to inject holes and electrons into the light emitting layer from the anode and the cathode respectively. When the electrons and the holes meet in the light emitting layer, the electrons and the holes recombine to produce excitons. When transforming from an excited state to a ground state, these excitons emit light. In order to inject the electrons and the holes from an electrode into the light emitting layer smoothly under a relatively low driving voltage, a hole injection layer and a hole transport layer are arranged between the anode and the light emitting layer, and an electron injection layer and an electron transport layer are arranged between the cathode and the light emitting layer. In order to make the OLED achieve higher light emitting efficiency, and design of the electron transport layer is relatively important.

SUMMARY

The following is a brief summary of subject matters described herein in detail. This summary is not intended to limit the scope of protection of claims.

In an aspect, an exemplary embodiment of the present disclosure provides an organic light emitting device, including an anode, a cathode, and a light emitting layer and an electron transport layer arranged between the anode and the cathode. The electron transport layer is arranged between the light emitting layer and the cathode. The electron transport layer includes a first host material and a second host material. A mixing ratio of the first host material to the second host material of one side of the electron transport layer close to the light emitting layer is different from a mixing ratio of the first host material to the second host material of one side of the electron transport layer away from the light emitting layer.

In an exemplary implementation mode, a refractive index of the first host material is greater than that of the second host material.

In an exemplary implementation mode, in a direction from a position close to the light emitting layer to a position away from the light emitting layer, a mass percentage of the first host material in the electron transport layer gradually decreases, and a mass percentage of the second host material in the electron transport layer gradually increases.

In an exemplary implementation mode, on the side of the electron transport layer close to the light emitting layer, the mass percentage of the first host material in the electron transport layer is 60% to 80%, and the mass percentage of the second host material in the electron transport layer is 20% to 40%.

In an exemplary implementation mode, on the side of the electron transport layer away from the light emitting layer, the mass percentage of the first host material in the electron transport layer is 0% to 10%, and the mass percentage of the second host material in the electron transport layer is 90% to 100%.

In an exemplary implementation mode, a thickness of the light emitting layer is 10 nm to 25 nm, and a thickness of the electron transport layer is 20 nm to 50 nm. On the side of the electron transport layer close to the light emitting layer, a refractive index of the electron transport layer is 1.80 to 2.00.

In an exemplary implementation mode, a thickness of the electron transport layer is 20 nm to 50 nm, and a thickness of the cathode is 10 nm to 20 nm. On one side of the electron transport layer close to the cathode, the refractive index of the electron transport layer is 1.55 to 1.70.

In an exemplary implementation mode, a hole injection layer, a hole transport layer, and an electron block layer are further arranged between the anode and the light emitting layer. A hole block layer is further arranged between the light emitting layer and the electron transport layer. An electron injection layer is further arranged between the electron transport layer and the cathode. A thickness of the hole injection layer is 5 nm to 20 nm. A thickness of the hole transport layer is 100 nm to 150 nm. A thickness of the electron block layer is 5 nm to 20 nm. A thickness of the light emitting layer is 10 nm to 25 nm. A thickness of the hole block layer is 5 nm to 15 nm. A thickness of the electron injection layer is 0.5 nm to 2 nm. On one side of the electron transport layer close to the hole block layer, the refractive index of the electron transport layer is 1.80 to 2.00. On one side of the electron transport layer close to the electron injection layer, the refractive index of the electron transport layer is 1.55 to 1.70.

In an exemplary implementation mode, the electron transport layer has a maximum red light refractive index $n_{RMAX}$ within a wavelength range of 600 nm to 640 nm, has a maximum green light refractive index $n_{GMAX}$ within a wavelength range of 510 nm to 550 nm, and has a maximum blue light refractive index $n_{BMAX}$ within a wavelength range of 440 nm to 480 nm. The electron transport layer satisfies:

$$|n_{BMAX}-n_{GMAX}| \le 0.4, |n_{BMAX}-n_{RMAX}| \le 0.8.$$

In an exemplary implementation mode, the maximum red light refractive index $n_{RMAX}$ is 1.81 to 1.91, the maximum green light refractive index $n_{GMAX}$ is 1.86 to 1.96, and the maximum blue light refractive index $n_{BMAX}$ is 1.90 to 2.00.

In an exemplary implementation mode, the electron transport layer has a minimum red light refractive index $n_{RMIN}$ within the wavelength range of 600 nm to 640 nm, has a minimum green light refractive index $n_{GMIN}$ within the wavelength range of 510 nm to 550 nm, and has a minimum blue light refractive index $n_{BMIN}$ within the wavelength range of 440 nm to 480 nm. The electron transport layer satisfies:

$$|n_{BMIN}-n_{GMIN}|\leq 0.5, |n_{BMIN}-n_{RMIN}|\leq 1.0.$$

In an exemplary implementation mode, the minimum red light refractive index $n_{RMIN}$ is 1.55 to 1.65, the maximum green light refractive index $n_{GMIN}$ is 1.57 to 1.67, and the maximum blue light refractive index $n_{BMIN}$ is 1.60 to 1.70.

In another aspect, an exemplary embodiment of the present disclosure further provides a display apparatus, including the foregoing organic light emitting device.

In another aspect, an exemplary embodiment of the present disclosure further provides a method for preparing the organic light emitting device, and the method includes:

forming an anode;

forming a light emitting layer;

forming an electron transport layer, wherein the electron transport layer includes a first host material and a second host material, a mixing ratio of the first host material to the second host material of one side of the electron transport layer close to the light emitting layer is different from a mixing ratio of the first host material to the second host material of one side of the electron transport layer away from the light emitting layer; and forming a cathode.

In an exemplary implementation mode, forming the electron transport layer includes: using a manner of performing co-evaporation on the first host material and the second host material. In a process from the beginning of evaporation to the end of the evaporation, the evaporation rate of the first host material is controlled to gradually decrease, and the evaporation rate of the second host material is controlled to gradually increase, so that a mass percentage of the first host material in the electron transport layer gradually decreases and a mass percentage of the second host material in the electron transport layer gradually increases in a direction from a position close to the light emitting layer to a position away from the light emitting layer.

In an exemplary implementation mode, at the beginning of the evaporation, the evaporation rate of the first host material is controlled to be 6 Å/s to 8 Å/s, and the evaporation rate of the second host material is controlled to be 2 Å/s to 4 Å/s. At the end of the evaporation, the evaporation rate of the first host material is controlled to be 0 Å/s to 1 Å/s, and the evaporation rate of the second host material is controlled to be 9 Å/s to 10 Å/s.

Other aspects may be understood upon reading and understanding of the accompanying drawings and the detailed description.

BRIEF DESCRIPTION OF DRAWINGS

Accompanying drawings are used to provide further understanding of technical solutions of the present disclosure, constitute a part of the specification, and are used to explain the technical solutions of the present disclosure together with embodiments of the present disclosure, thus do not constitute a limitation on the technical solutions of the present disclosure. Shapes and sizes of components in the accompanying drawings do not reflect actual scales and are only intended to illustrate the contents of the present disclosure.

REFERENCE SIGNS IN THE DRAWINGS

Figure 1:
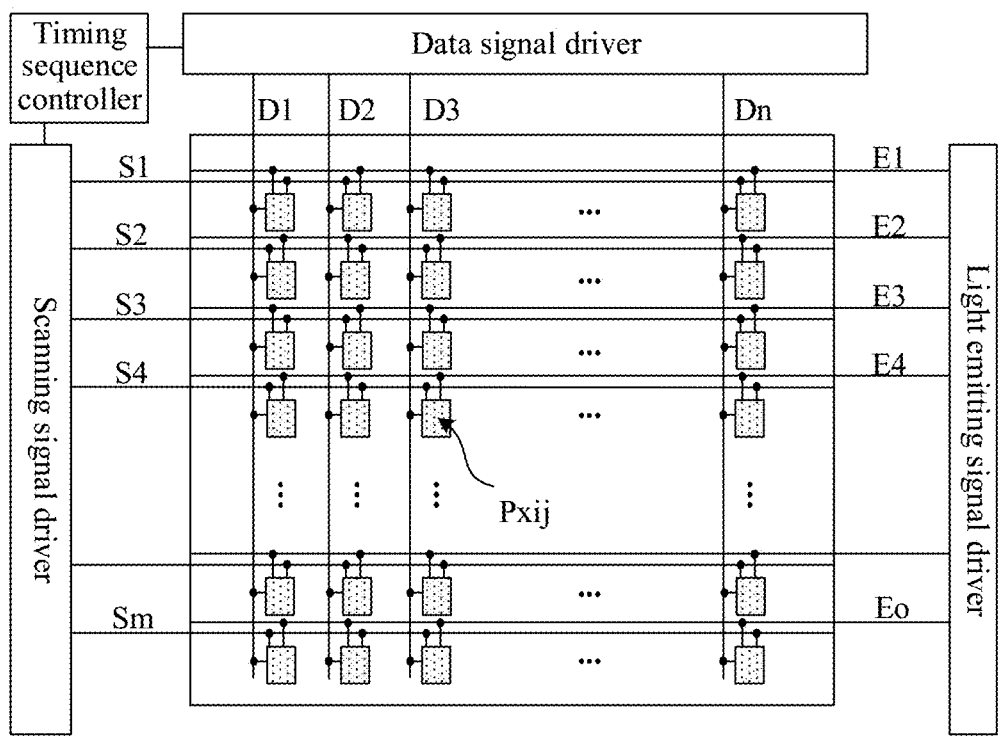
FIG. 1 illustrates a schematic structural diagram of a display apparatus.

10—anode;
20—hole injection layer;
30—hole transport layer;
40—electron block layer;
50—hole block layer;
60—hole block layer;
70—electron transport layer;
80—electron injection layer;
90—cathode;
101—base substrate;
102—driving circuit layer;
103—light emitting structure layer;
104—encapsulation layer;
210—driving transistor;
211—storage capacitor;
301—anode;
302—pixel definition layer;
303—organic light emitting layer;
304—cathode;
401—first encapsulation layer;
402—second encapsulation layer;
403—third encapsulation layer.

DETAILED DESCRIPTION

Implementation modes herein may be implemented in multiple different forms. Those of ordinary skills in the art can readily appreciate a fact that the implementation modes and contents may be varied into various forms without departing from the spirit and scope of the present disclosure. Therefore, the present disclosure should not be construed as only being limited to the contents recorded in the following embodiments. The embodiments in the present disclosure and features in the embodiments may be combined with each other randomly of there is no conflict.

In the accompanying drawings, a size of a constituent element, and a thickness or an area of a layer is sometimes exaggerated for clarity. Therefore, any one implementation mode of the present disclosure is not necessarily limited to dimensions shown in the drawings, and the shapes and sizes of the components in the accompanying drawings do not reflect actual scales. In addition, the accompanying drawings schematically show an ideal example, and any one implementation mode of the present disclosure is not limited to the shapes, values, or the like shown in the accompanying drawings.

Ordinal numerals such as "first", "second", and "third" herein are set to avoid confusion between constituent elements, but are not intended to limit in terms of quantity.

Herein, for convenience, wordings indicating orientations or positional relationships, such as "center", "upper", "lower", "front", "back", "vertical", "horizontal", "top", "bottom", "inside", "outside", and the like are used to describe the positional relationships between the constituent elements with reference to the accompanying drawings, and are merely for facilitating describing the implementation modes and simplifying the specification, rather than indicating or implying that the referred apparatuses or elements must have particular orientations, and be constructed and operated in particular orientations. Thus, they cannot be construed as a limitation on the present disclosure. The positional relationships between the constituent elements can be appropriately changed according to directions according to which the constituent elements are described. Therefore, appropriate replacements can be made according to situations without being limited to the wordings described in the specification, and.

Herein, unless otherwise specified and defined explicitly, terms "mount", "mutually connect", "connect" and the like should be understood in a broad sense. For example, the terms may refer to fixed connection, or detachable connection, or integrated connection. The terms may refer to mechanical connection or electrical connection. The terms may refer to direct mutual connection, may also refer to indirect connection through a middleware, and may refer to internal communication between two components. For those of ordinary skills in the art, meanings of the abovementioned terms in the present disclosure can be understood according to situations.

Herein, a transistor refers to an element at least including three terminals, i.e., a gate electrode, a drain electrode, and a source electrode. A transistor has a channel area between a drain electrode (or referred to as a drain electrode terminal, a drain region, or a drain electrode) and a source electrode (or referred to as a source electrode terminal, a source region, or a source electrode), and a current can flow through the drain electrode, the channel area, and the source electrode. Herein, the channel region refers to a region through which the current mainly flows.

Herein, a first electrode may be the drain electrode, and a second electrode may be the source electrode; or the first electrode may be the source electrode, and the second electrode may be the drain electrode. Herein, functions of the "source electrode" and the "drain electrode" are sometimes interchangeable with each other in a case that transistors with opposite polarities are used or a current direction changes during circuit operation. Therefore, the "source electrode" and the "drain electrode" are interchangeable herein.

Herein, "electrical connection" includes a case that constituent elements are connected together by an element with a certain electrical effect. There is no specific restriction on "the elements with the certain electrical effect" as long as electrical signals can be sent and received between the connected constituent elements. For example, "the elements with the certain electrical effect" may be electrodes or wirings, or switch elements, such as transistors, or other functional elements, such as resistors, inductors, capacitors, or the like.

Herein, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

Herein, "film" and "layer" are interchangeable. For example, "conductive layer" may be replaced with "conductive film" sometimes. Similarly, "insulating film" may be replaced with "insulating layer" sometimes.

"About" herein refers to that a boundary is defined not so strictly and numerical values within process and measurement error ranges are allowed.

FIG. 1 illustrates a schematic structural diagram of a display apparatus. As shown in FIG. 1, an OLED display apparatus may include a timing sequence controller, a data signal driver, a scanning signal driver, a light emitting signal driver, and a pixel array. The pixel array may include multiple scanning lines (S1 to Sm), multiple data signal lines (D1 to Dn), multiple light emitting signal lines (E1 to Eo), and multiple sub-pixels Pxij. In an exemplary implementation mode, the timing sequence controller may provide the data signal driver with a gray value and a control signal which are suitable for the specification of the data signal driver, may provide the scanning signal driver with a clock signal, a scanning start signal and the like which are suitable for the specification of the scanning signal driver, and may provide the light emitting signal driver with a clock signal, a transmitting stop signal and the like which are suitable for the specification of the light emitting signal driver. The data signal driver may generate a data voltage to be supplied to the data signal lines D1, D2, D3, . . . , and Dn by using the gray value and the control signal received from the timing sequence controller. For example, the data signal driver may sample the gray value by using the clock signal, and apply a data voltage corresponding to the gray value to the data signal lines D1 to Dn by taking a pixel row as a unit, wherein n may be a natural number. The scanning signal driver may generate a scanning signal to be supplied to the scanning signal lines S1, S2, S3, . . . , and Sm by using the clock signal, the scanning start signal and the like received from the timing sequence controller. For example, the scanning signal driver may provide the scanning signal with on-level pulses for the scanning signal lines S1 to Sm sequentially. For example, the scanning signal driver may be constructed in a form of a shift register and may generate the scanning signal in a manner of sequentially transmitting the scanning start signal provided in a form of on-level pulses to a next-stage circuit under the control of the clock signal, wherein m may be a natural number. The light emitting signal driver may generate a transmitting signal to be supplied to the light emitting signal lines E1, E2, E3, . . . , Eo by receiving the clock signal, the transmitting stop signal and the like from the timing sequence controller. For example, the light emitting signal driver may provide the transmitting signal with off-level pulses for the light emitting signal lines E1 to Eo sequentially. For example, the light emitting signal driver may be constructed in a form of a shift register and may generate the light emitting signals in a manner of sequentially transmitting a light emitting stop signal provided in a form of off-level pulses to a next-stage circuit under control of the clock signal, wherein o may be a natural number. The pixel array may include multiple sub-pixels Pxij. Each sub-pixel Pxij may be connected to a corresponding data signal line, a corresponding scanning signal line, and a corresponding light emitting signal line, wherein i and j may be natural numbers. The sub-pixel Pxij may refer to a sub-pixel with a transistor therein being connected to the i-th scanning signal line and connected to the j-th data signal line.

Figure 2:
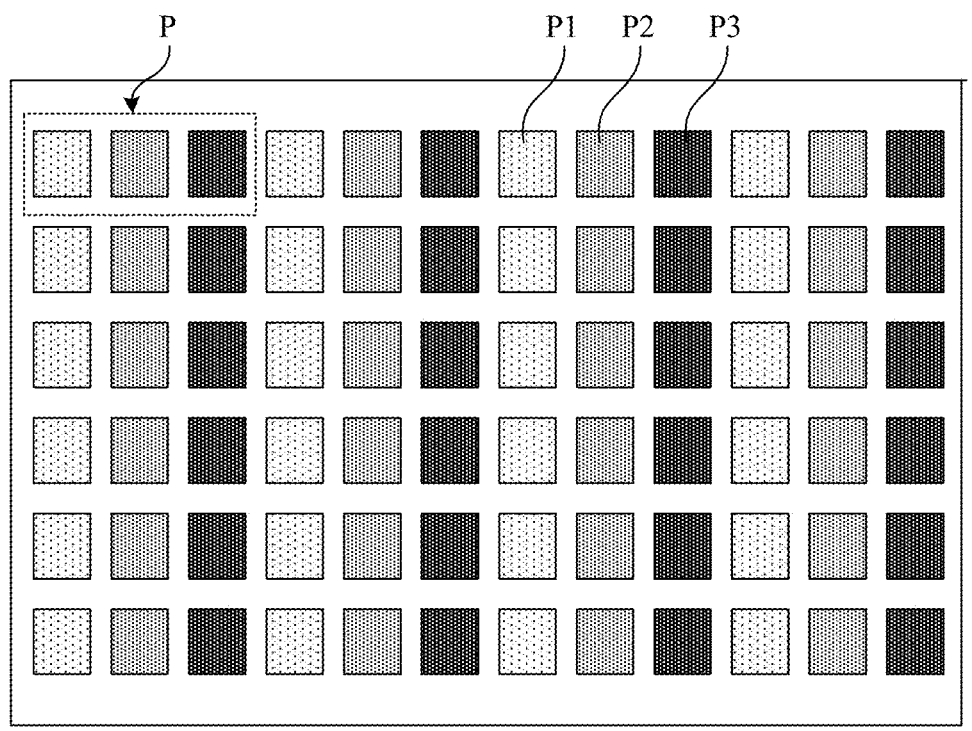
FIG. 2 illustrates a schematic diagram of a planar structure of a display apparatus.

FIG. 2 illustrates a schematic diagram of a planar structure of display apparatus. As shown in FIG. 2, in a plane parallel to the display apparatus, the display apparatus may include multiple pixel units P arranged in a matrix. At least one of the multiple pixel units P includes a first sub-pixel P1 that emits first-color light, a second sub-pixel P2 that emits second-color light, and a third sub-pixel P3 that emits third-color light. Each of the first sub-pixel P1, and the second sub-pixel P2, and the third sub-pixel P3 includes a pixel driving circuit and a light emitting device. Each pixel driving circuit in the first sub-pixel P1, the second sub-pixel P2, and the third sub-pixel P3 is respectively connected to a scanning signal line, a data signal line, and a light emitting signal line. The pixel driving circuit is configured to receive a data voltage transmitted by the data signal line under control of the scanning signal line and the light emitting signal line, and output a corresponding current to the light emitting device. Each light emitting device in the first sub-pixel P1, the second sub-pixel P2, and the third sub-pixel P3 is respectively connected to the pixel driving circuit of the sub-pixel where it is located. The light emitting device is configured to emit light with a corresponding brightness in response to the current output by the pixel driving circuit of the sub-pixel where it is located.

In an exemplary implementation mode, the pixel unit P may include a Red (R) sub-pixel, a Green (G) sub-pixel, and a Blue (B) sub-pixel, or may include a red sub-pixel, a green sub-pixel, a blue sub-pixel, and a white sub-pixel. No limits are made thereto in the present disclosure. In an exemplary implementation mode, a shape of the sub-pixels in the pixel unit may be a rectangle, a rhombus, a pentagon, or a hexagon. When the pixel unit includes three sub-pixels, the three sub-pixels may be arranged in parallel in a horizontal direction, in parallel in a vertical direction, or in a Delta shape. When the pixel unit includes four sub-pixels, the four sub-pixels may be arranged in parallel in the horizontal direction, in parallel in the vertical direction, or in a square. No limits are made thereto in the present disclosure.

Figure 3:
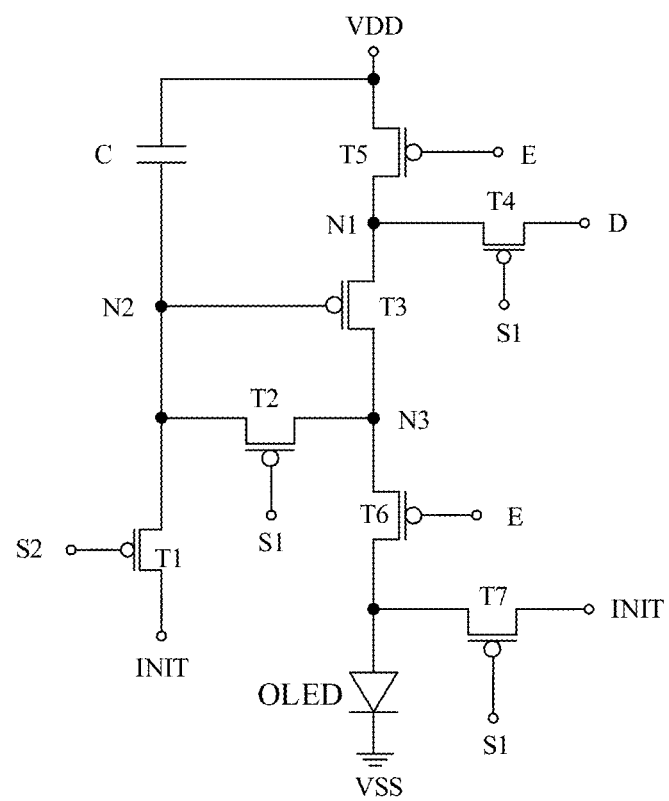
FIG. 3 illustrates a schematic diagram of an equivalent circuit of a pixel driving circuit.

In an exemplary implementation mode, the pixel driving circuit may have a 3T1C, 4T1C, 5T1C, 5T2C, 6T1C, or 7T1C structure. FIG. 3 illustrates a schematic diagram of an equivalent circuit of a pixel driving circuit. As shown in FIG. 3, the pixel driving circuit may include seven transistors (a first transistor T1 to a seventh transistor T7), one storage capacitor C, and seven signal lines (a data signal line D, a first scanning signal line S1, a second scanning signal line S2, a light emitting signal line E, an initial signal line INIT, a first power supply line VDD, and a second power supply line VSS).

In an exemplary implementation mode, a first terminal of the storage capacitor C is connected to the first power supply line VDD, and a second terminal of the storage capacitor C is connected to a second node N2, that is, the second terminal of the storage capacitor C is connected to a control electrode of a third transistor T3.

A control electrode of the first transistor T1 is connected to the second scanning signal line S2, a first electrode of the first transistor T1 is connected to the initial signal line INIT, and a second electrode of the first transistor is connected to the second node N2. When a scanning signal with an on-level is applied to the second scanning signal line S2, the first transistor T1 transmits an initialization voltage to the control electrode of the third transistor T3 so as to initialize quantity of electric charges of the control electrode of the third transistor T3.

A control electrode of the second transistor T2 is connected to the first scanning signal line S1, a first electrode of the second transistor T2 is connected to the second node N2, and a second electrode of the second transistor T2 is connected to a third node N3. When a scanning signal with an on-level is applied to the first scanning signal line S1, the control electrode and the second electrode of the third transistor T3 are connected with each other through the second transistor T2.

The control electrode of the third transistor T3 is connected to the second node N2, that is, the control electrode of the third transistor T3 is connected to the second terminal of the storage capacitor C. A first electrode of the third transistor T3 is connected to a first node N1, and a second electrode of the third transistor T3 is connected to the third node N3. The third transistor T3 may be referred to as a driving transistor. The third transistor T3 determines a magnitude of a driving current flowing between the first power supply line VDD and the second power supply line VSS according to a potential difference between the control electrode and the first electrode of the third transistor T3.

A control electrode of the fourth transistor T4 is connected to the first scanning signal line S1, a first electrode of the fourth transistor T4 is connected to the data signal line D, and a second electrode of the fourth transistor T4 is connected to the first node N1. The fourth transistor T4 may be referred to as a switching transistor, a scanning transistor, etc. When a scanning signal with an on-level is applied to the first scanning signal line S1, the fourth transistor T4 inputs a data voltage of the data signal line D to the pixel driving circuit.

A control electrode of the fifth transistor T5 is connected to the light emitting signal line E, a first electrode of the fifth transistor T5 is connected to the first power supply line VDD, and a second electrode of the fifth transistor T5 is connected to the first node N1. A control electrode of the sixth transistor T6 is connected to the light emitting signal line E, a first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When a light emitting signal with an on-level is applied to the light emitting signal line E, a driving circuit path is formed between the first power supply line VDD and the second power supply line VSS by the fifth transistor T5 and the sixth transistor T6, so as to drive the light emitting device to emit light.

A control electrode of the seventh transistor T7 is connected to the first scanning signal line S1, a first electrode of the seventh transistor T7 is connected to the initial signal line INIT, and a second electrode of the seventh transistor T7 is connected to the first electrode of the light emitting device. When a scanning signal with an on-level is applied to the first scanning signal line S1, the seventh transistor T7 transmits to an initialization voltage to the first electrode of the light emitting device, so as to initialize quantity of electric charges accumulated in the first electrode of the light emitting device or release the quantity of electric charges accumulated in the first electrode of the light emitting device.

In an exemplary implementation mode, a second electrode of the light emitting device is connected to the second power supply line VSS. A signal of the second power supply line VSS is a low-level signal. A signal of the first power supply line VDD is a high-level signal continuously provided. The first scanning signal line S1 is a scanning signal line in a pixel driving circuit of a present display row, and the second scanning signal line S2 is a scanning signal line in a pixel driving circuit of a previous display row. That is, for an n-th display row, the first scanning signal line S1 is S(n), and the second scanning signal line S2 is S(n−1). The second scanning signal line S2 of the present display row and the first scanning signal line S1 in the pixel driving circuit of the previous display row are the same signal line, which can reduce signal lines of a display panel, and achieve a narrow bezel of the display panel.

In an exemplary implementation mode, the first transistor T1 to the seventh transistor T7 may be P-type transistors or N-type transistors. Use of the same type of transistors in the pixel driving circuit may simplify a process flow, reduce process difficulties of the display panel, and improve the product yield. In some possible implementation modes, the first transistor T1 to the seventh transistor T7 may include P-type transistors and N-type transistors.

In an exemplary implementation mode, the first scanning signal line S1, the second scanning signal line S2, the light emitting signal line E, and the initial signal line INIT extend in a horizontal direction, and the second power supply line VSS, the first power supply line VDD, and the data signal line D extend in a vertical direction.

In an exemplary implementation mode, the light emitting device may be an Organic Light Emitting Device (OLED), including a first electrode (anode), an organic light emitting layer, and a second electrode (cathode) that are stacked.

Figure 4:
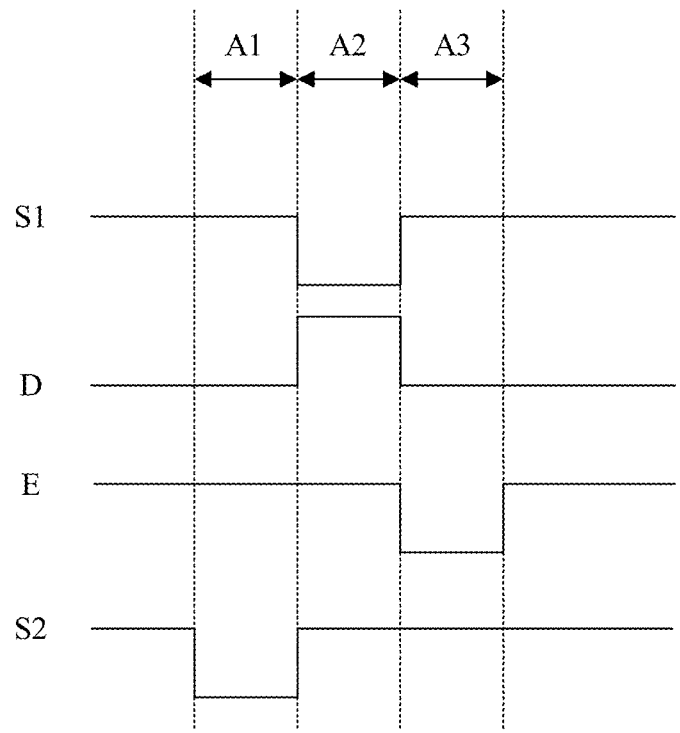
FIG. 4 illustrates an operating timing sequence diagram of a pixel driving circuit.

FIG. 4 illustrates an operating timing sequence diagram of a pixel driving circuit. The exemplary embodiment of the present disclosure will be described through an operating process of the pixel driving circuit shown in FIG. 3. The pixel driving circuit in FIG. 3 includes seven transistors (the first transistor T1 to the seventh transistor T7), one storage capacitor C, and seven signal lines (the data signal line D, the first scanning signal line S1, the second scanning signal line S2, the light emitting signal line E, the initial signal line INIT, the first power supply line VDD, and the second power supply line VSS), and the seven transistors are all P-type transistors.

In an exemplary implementation mode, the operating process of the pixel driving circuit may include:

In a first stage A1, referred to as a reset stage, a signal of the second scanning signal line S2 is a low-level signal, and signals of the first scanning signal line S1 and the light emitting signal line E are high-level signals. The signal of the second scanning signal line S2 being the low-level signal allows the first transistor T1 to be turned on, a signal of the initial signal line INIT is provided to the second node N2 to initialize the storage capacitor C, thereby clearing an original data voltage in the storage capacitor. Signals of the first scanning signal line S1 and the light emitting signal line E being the high-level signals allows the second transistor T2, the fourth transistor T4, the fifth transistor T5, the sixth transistor T6, and the seventh transistor T7 to be cut off. In this stage, the OLED does not emit light.

In a second stage A2, referred to as a data write stage or a threshold compensation stage, a signal of the first scanning signal line S1 is a low-level signal, the signals of the second scanning signal line S2 and the light emitting signal line E are high-level signals, and the data signal line D outputs a data voltage. In this stage, the second terminal of the storage capacitor C is at a low level, so that the third transistor T3 is turned on. The signal of the first scanning signal line S1 being the low-level signal allows the second transistor T2, the fourth transistor T4, and the seventh transistor T7 to be turned on. The second transistor T2 and the fourth transistor T4 are turned on so that the data voltage output by the data signal line D is provided to the second node N2 through the first node N1, the turned-on third transistor T3, the third node N3, and the turned-on second transistor T2, and a voltage difference between the data voltage output by the data signal line D and a threshold voltage of the third transistor T3 is charged into the storage capacitor C, wherein a voltage at the second terminal (the second node N2) of the storage capacitor C is Vd−|Vth|, Vd is the data voltage output by the data signal line D, and Vth is the threshold voltage of the third transistor T3. The seventh transistor T7 is turned on to provide an initialization voltage of the initial signal line INIT for a first electrode of the OLED to initialize (reset) the first electrode of the OLED and clear its internal pre-stored voltage, thereby completing the initialization and ensuring that the OLED does not emit light. The signal of the second scanning signal line S2 being the high-level signal allows the first transistor T1 to be cut off. The signal of the light emitting signal line E being the high-level signal allows the fifth transistor T5 and the sixth transistor T6 to be cut off.

In a third stage A3, referred to as a light emitting stage, the signal of the light emitting signal line E is a low-level signal, and the signals of the first scanning signal line S1 and the second scanning signal line S2 are high-level signals. The signal of the light emitting signal line E being a low-level signal allows the fifth transistor T5 and the sixth transistor T6 to be turned on, a power supply voltage output by the first power supply line VDD provides a drive voltage for the first electrode of the OLED through the turned-on fifth transistor T5, the third transistor T3, and the sixth transistor T6, thereby driving the OLED to emit light.

In a driving process of the pixel driving circuit, a driving current flowing through the third transistor T3 (the driving transistor) is determined by a voltage difference between a gate electrode and a first electrode of the third transistor T3. A voltage at the second node N2 is Vdata−|Vth|, so that the driving current of the third transistor T3 is:

$$I=K*(Vgs-Vth)^2=K*[(Vdd-Vd+|Vth|)-Vth]^2=K*[(Vdd-Vd)]^2$$

where I is the driving current flowing through the third transistor T3, that is, the driving current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power supply voltage output by the first power supply line VDD.

Figure 5:
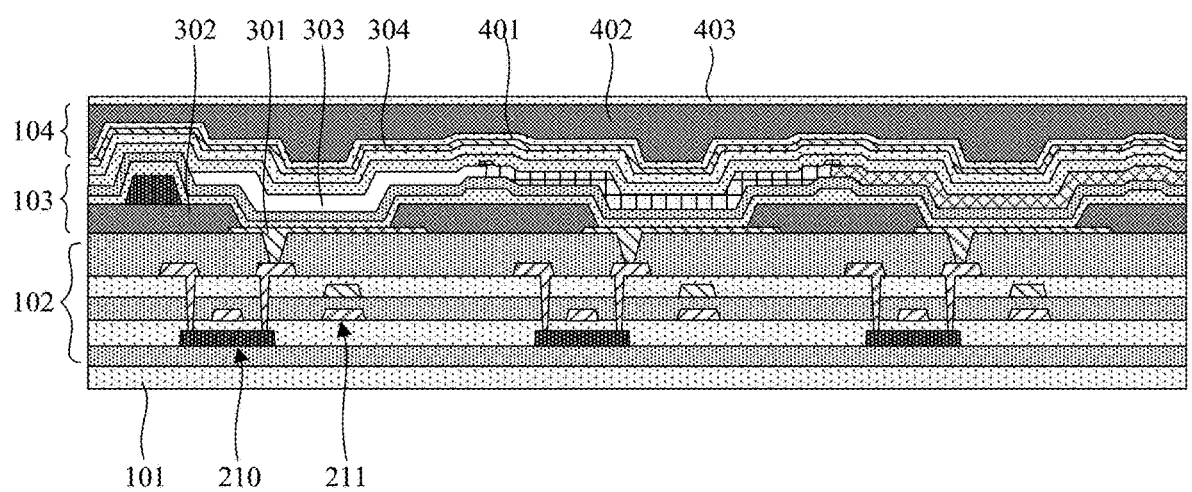
FIG. 5 illustrates a schematic sectional view of a display apparatus.

FIG. 5 illustrates a sectional view of a display apparatus, which illustrates structures of three sub-pixels of an OLED display apparatus. As shown in FIG. 5, in a plane perpendicular to the display apparatus, the display apparatus may include a driving circuit layer 102 arranged on a base substrate 101, a light emitting structure layer 103 arranged on one side, far away from the base substrate 101, of the driving circuit layer 102, and an encapsulation layer 104 arranged on one side of the light emitting structure layer 103 away from the substrate base 101. In some possible implementation modes, the display apparatus may include other film layers, such as a spacer posts, which are not limited in the present disclosure herein.

In an exemplary implementation mode, the base substrate may be a flexible substrate, or may be a rigid substrate. The flexible substrate may include a first flexible material layer, a first inorganic material layer, a semiconductor layer, a second flexible material layer, and a second inorganic material layer that are stacked. The first flexible substrate and the second flexible substrate may be made of materials, such as Polyimide (PI), Polyethylene Terephthalate (PET), or a soft polymer film after surface treatment. The first inorganic material layer and the second inorganic material layer may be made of silicon nitride (SiNx), silicon oxide (SiOx), or the like, and is used for improving water and oxygen resistance capability of the base substrate. The semicondutor may be made of amorphous silicon (a-si), polycrystalline silicon (p-si), or oxide.

In an exemplary implementation mode, the driving circuit layer 102 of each sub-pixel may include multiple transistors and a storage capacitor forming the pixel driving circuit. FIG. 5 illustrates by taking only one driving transistor and one storage capacitor as an example. In some possible implementation modes, the driving circuit layer 102 of each sub-pixel may include: a first insulating layer arranged on a base substrate, an active layer arranged on the first insulating layer, a second insulating layer covering the active layer, a gate electrode and a first capacitance electrode arranged on the second insulating layer, a third insulating layer covering the gate electrode and the first capacitance electrode, a second capacitance electrode arranged on the third insulating layer, a fourth insulating layer covering the second capacitance electrode, via holes formed in the second insulating layer, the third insulating layer, and the fourth insulating layer, with the active layer being exposed by the via holes, a source electrode and a drain electrode arranged on the fourth insulating layer, with the source electrode and the drain electrode being respectively connected to the active layer through the via holes, and a planarization layer covering the foregoing structures, wherein a via hole is formed in the planarization layer, and a drain electrode is exposed by the via hole. The active layer, the gate electrode, the source electrode, and the drain electrode form a transistor 210, and the first capacitance electrode and the second capacitance electrode form a storage capacitor 211.

In an exemplary implementation mode, the light emitting structure layer 103 includes a light emitting device that enables an organic material to emit light under the action of an electric field, and the light emitting structure layer 103 may include an anode 301, a pixel definition layer 302, an organic light emitting layer 303, and a cathode 304. The anode 301 is arranged on the planarization layer 205 and is connected to the drain electrode of the driving transistor 210 through a via hole formed in the planarization layer 205. The pixel definition layer 302 is arranged on the anode 301 and the planarization layer 205, a pixel opening is formed in the pixel definition layer 302, and the anode 301 is exposed by the pixel opening. The organic light emitting layer 303 is at least partially arranged in the pixel opening, and the organic light emitting layer 303 is connected to the anode 301. The cathode 304 is arranged on the organic light emitting layer 303, and the cathode 304 is connected to the organic light emitting layer 303. The organic light emitting layer 303 is driven by the anode 301 and the cathode 304 to emit light of a corresponding color.

In an exemplary implementation mode, the encapsulation layer 104 may include a first encapsulation layer 401, a second encapsulation layer 402, and a third encapsulation layer 403 that are stacked. The first encapsulation layer 401 and the third encapsulation layer 403 may be made of an inorganic material, and the second encapsulation layer 402 may be made of an organic material. The second encapsulation layer 402 is arranged between the first encapsulation layer 401 and the third encapsulation layer 403, which can ensure that external moisture cannot enter the light emitting structure layer 103.

In an exemplary implementation mode, the organic light emitting layer of the OLED may include a Light Emitting Layer (EML for short), and include any one or more of the following: a Hole Injection Layer (HIL for short), a Hole Transport Layer (HTL for short), a Hole Block Layer (HBL for short), an Electron Block Layer (EBL for short), an Electron Injection Layer (EIL for short), and an Electron Transport Layer (ETL for short). Under the driving of the voltage of the anode and the cathode, light is emitted as required by utilizing the light emitting characteristics of the organic material.

In an exemplary implementation mode, the light emitting layers of the OLED of different colors are different. For example, a red light emitting device includes a red light emitting layer, a green light emitting device includes a green light emitting layer, and a blue light emitting device includes a blue light emitting layer. In order to reduce the process difficulty and improve the yield, the hole injection layer and the hole transport layer located on one side of the light emitting layer may be a common layer, and the electron injection layer and the electron transport layer located on the other side of the light emitting layer may be a common layer. In an exemplary implementation mode, any one or more of the hole injection layer, the hole transport layer, the electron injection layer, and the electron transport layer may be manufactured by one process (one evaporation process or one ink-jet printing process), while isolation is achieved by surface segment difference of the formed film layers, by surface treatment, or the like. For example, any one or more of the hole injection layer, the hole transport layer, the electron injection layer, and the electron transport layer corresponding to adjacent sub-pixels may be isolated. In an exemplary implementation mode, the organic light emitting layer may be prepared through an evaporation process or an ink-jet process.

As the market requires higher and higher resolution of products, higher and higher brightness of individual sub-pixels, and lower and lower power consumption of the products, higher requirements are put forward for light output efficiency and brightness of light emitting devices in display apparatuses. According to different light emitting positions, OLED display apparatuses may be divided into bottom-emission OLED display apparatuses and top-emission OLED display apparatuses. Although a top-emission OLED display apparatus has characteristics such as improving the light emitting efficiency, improving the color purity, and obvious enhancement effect on display effects i, there are also losses such as internal optical waveguide, surface plasmon polaritons, and non-radiation dissipation, which reduces the light output efficiency. In an OLED display apparatus, in order to enhance the light emitting efficiency of a device, an external light extraction structure is usually arranged, for example, a light output coupling layer is arranged on a translucent cathode, or a layer of dielectric with high refractive index is arranged on a surface of the translucent cathode.

Figure 6:
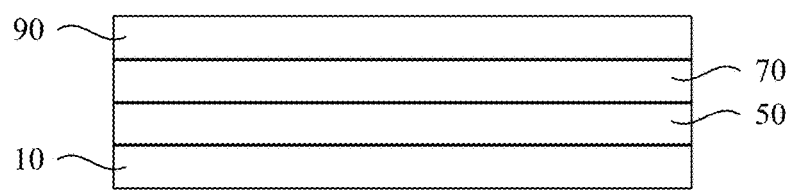
FIG. 6 illustrates a schematic structural diagram of a light emitting device according to an exemplary embodiment of the present disclosure.

FIG. 6 illustrates a schematic structural diagram of a light emitting device according to an exemplary embodiment of the present disclosure. As shown in FIG. 6, the light emitting device is an organic light emitting device, which may include an anode 10, a cathode 90, and an organic light emitting layer arranged between the anode 10 and the cathode 90. In an exemplary implementation mode, the organic light emitting layer may include an EML 50 and an ETL 70 that are stacked. The electron transport layer 70 is arranged between the light emitting layer 50 and the cathode 90. In an exemplary implementation mode, the light emitting layer 50 is configured to recombine electrons and holes to emit light, and the electron transport layer 70 is configured to realize directed and ordered controllable migration of injected electrons.

In an exemplary implementation mode, the electron transport layer may at least include a first host material and a second host material. In a direction from the light emitting layer 50 to the cathode 90, a mass percentage of the first host material in the electron transport layer gradually decreases, a mass percentage of the second host material in the electron transport layer gradually increases. In an exemplary implementation mode, the first host material and the second host material may satisfy:

$$N_1 > N_2;$$

Herein, $N_1$ is a refractive index of the first host material, and $N_2$ is a refractive index of the second host material. For example, the refractive index $N_1$ of the first host material may be about 1.8 (@460 nm), and the refractive index $N_2$ of the second host material may be about 1.6 (@ 460 nm).

In an exemplary implementation mode, the refractive index of the material may be measured by using an ellipsometer instrument, and @460 nm represents the refractive index measured at a wavelength of 460 nm.

In an exemplary implementation mode, on a first side of the electron transport layer close to the light emitting layer, the refractive index of the electron transport layer may be about 1.80 to 2.00.

In an exemplary implementation mode, on a second side of the electron transport layer away from the light emitting layer (close to the cathode), the refractive index of the electron transport layer may be about 1.55 to 1.70.

In an exemplary implementation mode, a thickness of the electron transport layer may be about 20 nm to 50 nm.

In an exemplary implementation mode, the first host material and the second host material may include, but are not limited to, the following materials: 8-hydroxyquinoline aluminum (Alq3), 4,7-diphenyl-1,10-phenanthroline (BPhen), and 1,3,5-tris (1-phenyl-1H-benzimidazol-2-yl) benzene (TPBI).

In an exemplary implementation mode, for the first host material and the second host material, a co-evaporation manner may be used to make the first host material and the second host material uniformly dispersed in the electron transport layer. A mixing ratio may be regulated and controlled by controlling an evaporation rate of the first host material and an evaporation rate of the second host material in an evaporation process. For example, in the evaporation process, the evaporation rate of the first host material is controlled to be about 3 Å/s, and the evaporation rate of the second host material is controlled to be about 7 Å/s, so as to realize that a mass percentage of the first host material in the electron transport layer is about 30%, and a mass percentage of the second host material in the electron transport layer is about 70%.

In an OLED structure, the refractive index of the electron transport layer is generally fixed. When a light wave (an electromagnetic wave) is incident on an interface between a metal and the dielectric, free electrons on the surface of the metal oscillate collectively. The electromagnetic wave is coupled with the free electrons on the surface of the metal to form a near-field electromagnetic wave propagating along the surface of the metal. If an oscillation frequency of the electrons coincides with a frequency of the incident light wave, resonance occurs. In a resonance state, energy of an electromagnetic field is effectively converted into collective vibration energy of the free electrons on the surface of the metal, and a special electromagnetic mode is formed at this time: the electromagnetic field is confined to a small range on the surface of the metal and is enhanced, and such phenomenon is referred to as a Surface Plasmon Polariton (SPP) effect, which will result in reduced efficiency of the exiting light. In order to reduce the phenomenon of surface plasmon polariton between the electron transport layer and the cathode to reduce optical loss, the electron transport layer needs to be made of a material with a small refractive index. However, a film layer reflection effect between the electron transport layer with the small refractive index and the light emitting layer is low, a micro-cavity effect of the entire device is reduced, and the light emitting efficiency of the light emitting device is reduced. In order to improve the film layer reflection effect between the electron transport layer and the light emitting layer, the electron transport layer needs to be made of a material with a large refractive index. However, the phenomenon of surface plasmon polariton between the electron transport layer with the large refractive index and the cathode is severe, the optical loss increases, thus the light emitting efficiency of the light emitting device is reduced. The electron transport layer of an exemplary embodiment of the present disclosure is formed by mixing the first host material and the second host material with different refractive indexes, and mixing ratios of the first host material and the second host material at different positions are different. The refractive index of one side of the electron transport layer close to the light emitting layer is greater than the refractive index of one side of the electron transport layer away from the light emitting layer, which makes the match of the refractive indexes as reasonable as possible in a multi-layer system, optimizes optical performance of the light emitting device, effectively improves a coupling light output efficiency inside the light emitting device, and is more conducive to giving full play to light output characteristics of the device.

In the exemplary embodiment of the present disclosure, the refractive index of the side of the electron transport layer away from the light emitting layer is reduced, which effectively reduces the phenomenon of surface plasmon polariton between the electron transport layer and the cathode, and reduces the optical loss. The refractive index of the side of the electron transport layer close to the light emitting layer is increased, which effectively improves the film layer reflection effect between the electron transport layer and the light emitting layer, and enhances the micro-cavity effect of the entire device. Therefore, the exemplary embodiment of the present disclosure makes the match of the refractive indexes as reasonable as possible in the multi-layer system, optimizes the optical performance of the light emitting device, effectively improves the coupling light output efficiency inside the light emitting device, and is more conducive to giving full play to the light output characteristics of the device.

In an exemplary implementation mode, the light emitting layer may be a red light emitting layer, or a green light emitting layer, or a blue light emitting layer. An overall performance of the light emitting device can be better improved by improving light emitting efficiency of the red light emitting layer, the green light emitting layer, and the blue light emitting layer.

Figure 7:
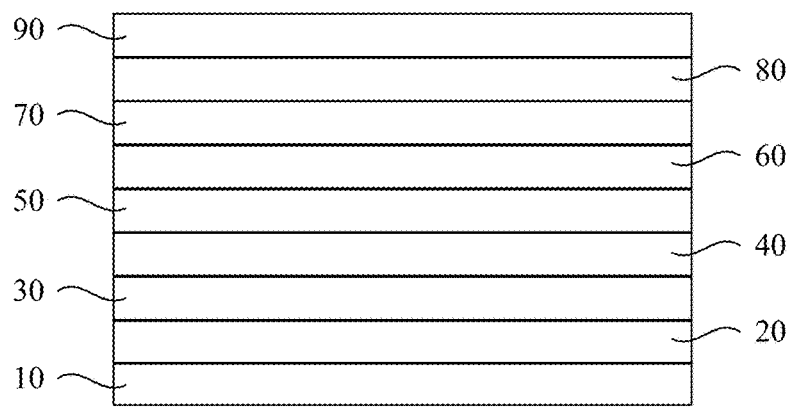
FIG. 7 illustrates a schematic structural diagram of another light emitting device according to an exemplary embodiment of the present disclosure.

FIG. 7 illustrates a schematic structural diagram of another light emitting device according to an exemplary embodiment of the present disclosure. As shown in FIG. 7, the light emitting device is an organic light emitting device, which may include an anode 10, a cathode 90, and an organic light emitting layer arranged between the anode 10 and the cathode 90. In an exemplary implementation mode, the organic light emitting layer may include a hole injection layer 20, a hole transport layer 30, an electron block layer 40, a light emitting layer 50, a hole block layer 60, an electron transport layer 70, and an electron injection layer 80 that are stacked. The hole injection layer 20, the hole transport layer 30, and the electron block layer 40 are arranged between the anode 10 and the light emitting layer 50. The hole injection layer 20 is connected to the anode 10. The electron block layer 40 is connected to the light emitting layer 50. The hole transport layer 30 is arranged between the hole injection layer 20 and the electron block layer 40. The hole block layer 60, the electron transport layer 70, and the electron injection layer 80 are arranged between the light emitting layer 50 and the cathode 90. The hole block layer 60 is connected to the light emitting layer 50. The electron injection layer 80 is connected to the cathode 90. The electron transport layer 70 is arranged between the hole block layer 60 and the electron injection layer 80. In an exemplary implementation mode, the hole injection layer 20 is configured to reduce a potential barrier of holes injected from the anode, so that the holes can be effectively injected into the light emitting layer 50 from the anode. The hole transport layer 30 is configured to realize directed and ordered controllable migration of the injected electrons. The electron block layer 40 is configured to form a migration potential barrier for electrons to prevent the electrons from migrating out from the light emitting layer 50. The light emitting layer 50 is configured to recombine electrons and holes to emit light. The hole block layer 60 is configured to form a migration potential barrier for holes to prevent the holes from migrating out from the light emitting layer 50. The hole transport layer 70 is configured to realize directed and ordered controllable migration of the injected electrons. The electron injection layer 80 is configured to reduce a potential barrier of holes injected from the cathode, so that the electrons can be effectively injected into the light emitting layer 50 from the cathode.

In an exemplary implementation mode, the material and the structure of the electron transport layer 70 are the same or similar to the material and the structure of the foregoing embodiments. On one side of the electron transport layer 70 close to the hole block layer 60, the refractive index of the electron transport layer 70 may be about 1.80 to 2.00, and on one side of the electron transport layer 70 close to the electron injection layer 80, the refractive index of the electron transport layer 70 may be about 1.55 to 1.70.

In an exemplary implementation mode, the anode may be made of a metal or a metal oxide material with a high work function. For a bottom-emission type, the anode may be made of a transparent oxide material such as indium tin oxide (ITO) or indium zinc oxide (IZO), and a thickness of the anode may be 80 nm to 200 nm. For a top-emission type, the anode may be made of a metal material such as silver (Ag), gold (Au), or an alloy thereof, or a composite structure of a metal or a transparent oxide, such as Ag/ITO, Ag/IZO, or ITO/Ag/ITO. A thickness of the metal layer in the anode may be about 80 nm to 100 nm, and a thickness of the transparent oxide in the anode may be about 5 nm to 20 nm, so that an average reflectivity of the anode in a visible light area is about 85% to 95%, which achieves an effect of a total reflection anode.

In an exemplary implementation mode, for an OLED of the top-emission type, the cathode may be formed by an evaporation process by using a metal material. The metal material may be magnesium (Mg), silver (Ag), or aluminum (Al), or an alloy material such as an alloy of Mg:Ag. A ratio of Mg:Ag is about 9:1 to 1:9. A thickness of the cathode may be 10 nm to 20 nm, so that an average transmittance of the cathode at a wavelength of 530 nm is about 50% to 60%, which achieves a transflective effect. For an OLED of the bottom-emission type, the cathode may be made of an alloy of magnesium (Mg), silver (Ag), aluminum (Al), or an alloy of Mg:Ag. A thickness of the cathode may be about greater than 80 nm, so that the cathode has good reflectivity and achieves an effect of a total reflection cathode.

In an exemplary implementation mode, the hole injection layer may be made of an inorganic oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide, or may be made of a p-type dopant of a strong electron absorption system and a dopant of a hole transport material, such as hexacyanohexaazatriphenylene, 2,3,5,6-tetrafluoro-7,7',8,8'-tetracyano-p-quinodimethane (F4-TCNQ), or 1,2,3-tris[(cyano)(4-cyano-2,3,5,6-tetrafluorophenyl) methylene] cyclopropane.

In an exemplary implementation mode, a thickness of the hole injection layer may be about 5 nm to 20 nm.

In an exemplary implementation mode, the hole transport layer and the electron block layer may be made of an arylamine or carbazole material having a relatively high hole mobility, such as 4,4'-bis[N-(1-naphthyl)-N-phenylamino] biphenyl (NPB), N,N'-bis (3-methylphenyl)-N, N'-diphenyl-[1,1'-biphenyl]-4,4'-diamine (TPD), 4-phenyl-4'-(9-phenylfluoren-9-yl) triphenyl amine (BAFLP), 4,4'-bis[N-(9,9-dimethylfluoren-2-yl)-N-phenyl amino]biphenyl (DFLDPBi), 4,4'-di(9-carbazolyl) biphenyl (CBP), or 9-phenyl-3-[4-(10-phenyl-9-anthryl) phenyl]-9H-carbazole (PCzPA).

In an exemplary implementation mode, a thickness of the hole transport layer may be about 100 nm to 150 nm, and a thickness of the electron block layer may be about 5 nm to 20 nm, which achieves an effect of adjusting a length of the micro-cavity, and improves light output performance of the light emitting device.

In an exemplary implementation mode, the light emitting layer may be made f an organic small molecule material, a quantum dot material, or the like, which include, but are not limited to, oxadiazole and derivatives thereof, triazole and derivatives thereof, rhodamine and its derivatives, 1,8-naphthalimide derivatives, pyrazoline derivatives, triphenylamine derivatives, CdSe/ZnS, PbS quantum dots, etc.

In an exemplary implementation mode, a material of the light emitting layer may include one material, or may include a mixture of two or more materials. The light emitting materials include a blue light emitting material, a green light emitting material, and a red light emitting material. The blue light emitting material may be selected from pyrene derivatives, anthracene derivatives, fluorene derivatives, perylene derivatives, styrylamine derivatives, metal complexes, or the like. For example, N1,N6-bis([1, 1'-biphenyl]-2-yl)-N1,N6-bis([1,1'-biphenyl]-4-yl)pyrene-1, 6-diamine, 9,10-di-(2-naphthyl) anthracene (ADN), 2-methyl-9,10-di-2-naphthylanthracene (MADN), 2,5,8,11-tetra-tert-butylperylene (TBPe), 4,4'-bis[4-(diphenylamino)

styryl]biphenyl (BDAV Bi), 4,4'-bis[4-(di-p-tolylamino) styryl]biphenyl (DPAVBi), and bis(4,6-difluorophenyl pyridine-C2,N) pyridinozoyl iridium (FIrpic).

The green light emitting material may be selected from, for example, coumarin dyes, quinacridine copper-based derivatives, polycyclic aromatic hydrocarbons, diamine anthracene-based derivatives, carbazole derivatives, or metal complexes. For example, coumarin 6 (C-6), coumarin 545T (C-525T), quinacridone copper (QA), N,N'-dimethylquinacridone (DMQA), 5,12-diphenylnaphthonaphthalene (DPT), N10,N10'-diphenyl-N10,N10'-dibenzoyl-9,9'-dianthracene-10,10'-diamine (BA-NPB for short), tris(8-hydroxyquinoline) aluminum (III) (Alq3 for abbreviation), tris(2-phenylpyridine) iridium (Ir(ppy)3), bis(2-phenylpyridine) iridium acetylacetonate (Ir(ppy)2(acac)). The red light emitting material may be selected from, for example, DCM-series materials or metal complexes. For example, 4-(dicyanomethylene)-2-methyl-6-(4-dimethylaminostyryl)-4H-pyran (DCM), 4-(dicyanomethylene)-2-tert-butyl-6-(1,1,7,7-tetramethyljulolidin-9-enyl)-4H-pyran (DCJTB), bis(1-phenylisoquinoline) (acetylacetone) iridium(III) (Ir(piq)2 (acac)), platinum octaethylporphyrin (PtOEP for abbreviation), and bis (2-(2'-benzothiophene)pyridine-N, C3') (acetylacetone) iridium (Ir(btp)2(acac) for abbreviation).

In an exemplary implementation mode, the light emitting layer including a mixture of two or more materials may include a host material and a guest material. A doping proportion of the guest material is 1% to 20%. Within a range of the doping proportion, the host material can efficiently transfer exciton energy to the guest material to excite the guest material to emit light. The guest material is diluted by the host material, which can effectively improve intermolecular collision of the guest material and fluorescence quenching caused by the mutual collision of energy, improve the light emitting efficiency, and prolong the service life of the device.

In an exemplary implementation mode, the doping ratio refers to a ratio of a mass of the guest material to a mass of the light emitting layer, that is, a mass percentage. In an exemplary implementation mode, the host material and the guest material may be co-evaporated through a multi-source evaporation process, so that the host material and the guest material are uniformly dispersed in the light emitting layer, the doping ratio may be regulated and controlled by controlling the evaporation rate of the guest material, or the doping ratio may be regulated and controlled by controlling a ratio of the evaporation rates of the host material and the guest material in an evaporation process in an evaporation process.

In an exemplary implementation mode, a thickness of the light emitting layer 50 may be about 10 nm to 25 nm.

In an exemplary implementation mode, the hole block layer may be made of aromatic heterocyclic compounds, for example, imidazole derivatives such as benzimidazole derivatives, imidazopyridine derivatives, benzimidazole phenanthridine derivatives, etc.; oxazine derivatives such as pyrimidine derivatives and triazine derivatives; and chemical compounds, such as quinoline derivatives, isoquinoline derivatives, and phenanthroline derivatives, including nitrogen-containing hexatomic ring structures (also including the compounds with phosphine oxide substituents on heterocycles). For example, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenylyl)-1,2,4-triazole (TAZ), 3-(4-tert-butylphenyl)-4-(4-ethylphenyl)-5-(4-biphenylyl)-1,2,4-triazole (p-EtTAZ), red phenanthroline (BPhen), and bathocuproine (BCP) or 4,4-bis(5-methylbenzoxazol-2-yl) stilbene (BzOs).

In an exemplary implementation mode, a thickness of the hole block layer may be about 5 nm to 15 nm.

In an exemplary implementation mode, the electron injection layer may be made of an alkali metal or a metals such as lithium fluoride (LiF), ytterbium (Yb), magnesium (Mg), or calcium (Ca), or a compound of these alkali metals or metals.

In an exemplary implementation mode, a thickness of the electron injection layer may be about 0.5 nm to 2 nm.

In an exemplary implementation mode, for a an OLED of the top-emission type, a thickness of the organic light emitting layer between the cathode and the anode may be designed to meet a requirement on an optical path of an optical micro-resonator, so as to obtain optimal light output intensity and color.

In an exemplary implementation mode, the organic light emitting device may be applied to a display substrate that uses an OLED as a light emitting device, and uses a Thin Film Transistor (TFT) for signal control. In an exemplary implementation mode, the display substrate including the OLED may be prepared by using the following preparation method.

First, a driving circuit layer is formed on a base substrate through a patterning process. The driving circuit layer of each sub-pixel may include a driving transistor and a storage capacitor that form a pixel driving circuit.

Then, a planarization layer is formed on the base substrate on which the foregoing structures are formed, and a via hole exposing a drain electrode of the driving transistor is formed on the planarization layer of each sub-pixel.

Then, an anode is formed through a patterning process on the base substrate on which the foregoing structures are formed. The anode of each sub-pixel is connected to the drain electrode of the driving transistor through the via hole on the planarization layer.

Then, a pixel definition layer is formed through a patterning process on the base substrate on which the foregoing structures are formed. A pixel opening exposing the anode is formed in the pixel definition layer of each sub-pixel. Each pixel opening serves as a light-emitting area of a corresponding sub-pixel.

Then, a hole injection layer and a hole transport layer are evaporated in sequence by using an open mask on the base substrate on which the foregoing structures are formed. A common layer of the hole injection layer and the hole transport layer is formed on the organic light emitting device, that is, the hole injection layers of all sub-pixels are communicated, and the hole transport layers of all sub-pixels are communicated. For example, respective areas of the hole injection layer and the hole transport layer are approximately the same, but their thicknesses are different.

Then, an electron block layer and a red light emitting layer, an electron block layer and a green light emitting layer, and an electron block layer and a blue light emitting layer are respectively evaporated on different sub-pixels by using a Fine Metal Mask (FMM for short). The electron block layers and light emitting layers of adjacent sub-pixels may overlap with each other by a small amount (for example, an area of an overlapping portion accounts for less than 10% of an area of a pattern of the respective light emitting layer), or may be isolated from each other.

Then, a hole block layer, an electron transport layer, an electron injection layer, and a cathode are evaporated in sequence by using an open mask. A common layer of the hole block layer, the electron transport layer, the electron injection layer, and the cathode is formed on the organic light emitting device, that is, the hole block layers of all the sub-pixels are communicated, the electron transport layers of all the sub-pixels are communicated, the electron injection layers of all the sub-pixels are communicated, and the cathodes of all the sub-pixels are communicated.

In an exemplary implementation mode, since the electron transport layers are of a common layer, while the light emitting layers of different sub-pixels are isolated from each other, an orthographic projection of the electron transport layers on the base substrate includes orthographic projections of the light emitting layers on the base substrate, and an area of the electron transport layers is greater than an area of the light emitting layers.

In an exemplary implementation mode, since the electron transport layers are of a common layer, the orthographic projection of the electron transport layers on the base substrate includes orthographic projections of light emitting areas of two sub-pixels on the base substrate.

In an exemplary implementation mode, the orthographic projections of one or more of the hole injection layer, the hole transport layer, the hole block layer, the electron transport layer, the electron injection layer, and the cathode on the base substrate are continuous. In some examples, at least one of the hole injection layer, the hole transport layer, the hole block layer, the electron transport layer, the electron injection layer, and the cathode of at least one row or column of sub-pixels is communicated. In some examples, at least one of the hole injection layer, the hole transport layer, the hole block layer, the electron transport layer, the electron injection layer, and the cathode of multiple sub-pixels is communicated.

In an exemplary implementation mode, the organic light emitting layer may include a micro-cavity adjustment layer located between the hole transport layer and the light emitting layer. For example, after the hole transport layer is formed, a red micro-cavity adjustment layer and a red light emitting layer, a green micro-cavity adjustment layer and a green light emitting layer, and a blue micro-cavity adjustment layer and a blue light emitting layer are respectively evaporated at different sub-pixels by using a fine metal mask. In an exemplary implementation mode, the red micro-cavity adjustment layer, the green micro-cavity adjustment layer, and the blue micro-cavity adjustment layer may include an electron block layer.

In an exemplary implementation mode, the orthographic projections of the light emitting layers of at least part of sub-pixels on the substrate overlap with an orthographic projection of the pixel driving circuit on the substrate.

In an exemplary implementation mode, an electron transport layer may be evaporated by multi-source co-evaporation to form the electron transport layer including a first host material and a second host material, and a mixing ratio may be regulated and controlled by controlling the evaporation rate of the first host material and the evaporation rate of the second host material in an evaporation process.

In an exemplary implementation mode, on one side of the electron transport layer close to the light emitting layer, a mass percentage of the first host material in the electron transport layer is 60% to 80%, and a mass percentage of the second host material in the electron transport layer is 20% to 40%. For example, on the side of the electron transport layer close to light emitting layer the mass percentage of the first host material in the electron transport layer is 70%, and the mass percentage of the second host material in the electron transport layer is 30%.

In an exemplary implementation mode, on one side of the electron transport layer away from the light emitting layer, a mass percentage of the first host material in the electron transport layer is 0 to 10%, and a mass percentage of the second host material in the electron transport layer is 90 to 100%. For example, on the side of the electron transport layer away from the light emitting layer the mass percentage of the second host material in the electron transport layer is 100%.

In an exemplary implementation mode, the electron transport layer may be evaporated in the following manners: during a process from the beginning of evaporation to the end of the evaporation, the evaporation rate of the first host material decreases gradually, and the evaporation rate of the second host material increases gradually. For example, at the beginning of the evaporation, the evaporation rate of the first host material is 6 Å/s, and then the evaporation rate gradually decreases. At the end of the evaporation, the evaporation rate is 1 Å/s. At the beginning of the evaporation, the evaporation rate of the second host material is 4 Å/s, and then the evaporation rate gradually increases. At the end of the evaporation, the evaporation rate is 9 Å/s. Thus, on the side close to the light emitting layer, the mass percentage of the first host material in the electron transport layer is about 60%, and the mass percentage of the second host material is about 40%. On the side away from the light emitting layer, the mass percentage of the first host material in the electron transport layer is about 10%, and the mass percentage of the second host material is about 90%. For another example, at the beginning of the evaporation, the evaporation rate of the first host material is 8 Å, and then the evaporation rate gradually decreases. At the end of the evaporation, the evaporation rate is 0. At the beginning of the evaporation, the evaporation rate of the second host material is 2 Å/s, and then the evaporation rate gradually increases. At the end of the evaporation, the evaporation rate is 10 Å/s. Thus, on the side close to the light emitting layer, the mass percentage of the first host material in the electron transport layer is about 80%, and the mass percentage of the second host material is about 20%. On the side away from the light emitting layer, the mass percentage of the first host material in the electron transport layer is about 0, and the mass percentage of the second host material is about 100%.

In an exemplary implementation mode, a decreasing manner and a decreasing degree of the evaporation rate of the first host material and an increasing manner and an increasing degree of the evaporation rate of the second host material may be set according to actual situations, for example, continuous decrease or continuous increase may be used, or stepwise decrease or stepwise increase may be used, which are not limited in the present disclosure herein.

Table 1 shows the refractive index of the electron transport layer with different mixing ratios at a wavelength of 460 nm. As shown in Table 1, when the electron transport layer only includes the second host material (the ratio of the first host material to the second host material is about 0%:100%), the refractive index of the electron transport layer is low, and is only about 1.65. The refractive index of the electron transport layer can be increased by mixing with the first host material having a high refractive index. As the mass percentage of the first host material increases, the refractive index of the electron transport layer gradually increases. When the ratio of the first host material to the second host material in the electron transport layer is about 70%:30%, the refractive index of the electron transport layer can reach 1.95, and the refractive index of the electron transport layer increases by about 18%. Herein, the refractive index of the first host material is about 2.05 at the wavelength of 460 nm.

TABLE 1

Refractive index of electron transport layer with different mixing ratios at wavelength of 460 nm

| First host material:Second host material | Refractive index (wavelength 460 nm) |
|---|---|
| 0%:100% | 1.65 |
| 30%:70% | 1.79 |
| 50%:50% | 1.87 |
| 70%:30% | 1.95 |

Table 2 shows the refractive index of the electron transport layer with different mixing ratios at a wavelength of 530 nm. As shown in Table 2, when the electron transport layer only includes the second host material, the refractive index of the electron transport layer is low, and is only about 1.62. The refractive index of the electron transport layer can be increased by mixing with the first host material having a high refractive index. As the mass percentage of the first host material increases, the refractive index of the electron transport layer gradually increases. When the ratio of the first host material to the second host material in the electron transport layer is about 70%:30%, the refractive index of the electron transport layer can reach 1.91; and the refractive index of the electron transport layer increases by about 18%. Herein, the refractive index of the first host material is about 2.0 at the wavelength of 530 nm.

TABLE 2

Refractive index of electron transport layer with different mixing ratios at wavelength of 530 nm

| First host material:Second host material | Refractive index (wavelength 530 nm) |
|---|---|
| 0%:100% | 1.62 |
| 30%:70% | 1.75 |
| 50%:50% | 1.84 |
| 70%:30% | 1.91 |

Table 3 shows the refractive index of the electron transport layer with different mixing ratios at a wavelength of 620 nm. As shown in Table 3, when the electron transport layer only includes the second host material, the refractive index of the electron transport layer is low, and is only about 1.60. The refractive index of the electron transport layer can be increased by mixing with the first host material having a high refractive index. As the mass percentage of the first host material increases, the refractive index of the electron transport layer gradually increases. When the ratio of the first host material to the second host material in the electron transport layer is about 70%:30%, the refractive index of the electron transport layer can reach 1.86, and the refractive index of the electron transport layer increases by about 16%. Herein, the refractive index of the first host material is about 1.96 at a wavelength of 620 nm.

TABLE 3

Refractive index of electron transport layer with different mixing ratios at wavelength of 620 nm

| First host material:Second host material | Refractive index (wavelength 620 nm) |
|---|---|
| 0%:100% | 1.60 |
| 30%:70% | 1.69 |
| 50%:50% | 1.81 |
| 70%:30% | 1.86 |

In an exemplary implementation mode, at the beginning of the evaporation of the electron transport layer, the evaporation rate of the first host material is set as 70% $E_{MAX}$, and the evaporation rate of the second host material is set as 30% $E_{MAX}$. The ratio of the first host material to the second host material in the evaporated electron transport layer is about 70%:30%, so that the side of the electron transport layer close to the light emitting layer has a higher refractive index. Then, the evaporation rate of the first host material can be gradually decreased, and the evaporation rate of the second host material can be gradually increased. When the evaporation rate of the electron transport layer is completed, the evaporation rate of the first host material becomes 0, the evaporation rate of the second host material becomes $E_{MAX}$, and the ratio of the first host material to the second host material in the evaporated electron transport layer is about 0%:100%, so that the side of the electron transport layer close to the cathode has a lower refractive index.

In an exemplary implementation mode, the display substrate may include red sub-pixels that emits red light, green sub-pixels that emits green light, and blue sub-pixels that emits blue light. Since the electron transport layer is a common layer, the electron transport layer has different refractive indexes in areas where the red sub-pixels, the green sub-pixels, and the blue sub-pixels are located.

In an exemplary implementation mode, the electron transport layer has a maximum red light refractive index $n_{RMAX}$ within a wavelength range of 600 nm to 640 nm, has a maximum green light refractive index $n_{GMAX}$ within a wavelength range of 510 nm to 550 nm, and has a maximum blue light refractive index $n_{BMAX}$ within a wavelength range of 440 nm to 480 nm. In an exemplary implementation mode, the electron transport layer may meet:

$|n_{BMAX}-n_{GMAX}| \leq 0.4, |n_{BMAX}-n_{RMAX}| \leq 0.8$.

In an exemplary implementation mode, the electron transport layer has a minimum red light refractive index $n_{RMIN}$ within the wavelength range of 600 nm to 640 nm, has a minimum green light refractive index $n_{GMIN}$ within the wavelength range of 510 nm to 550 nm, and has a minimum blue light refractive index $n_{BMIN}$ within the wavelength range of 440 nm to 480 nm. In an exemplary implementation mode, the electron transport layer may meet:

$|n_{BMIN}-n_{GMIN}| \leq 0.5, |n_{BMIN}-n_{RMIN}| \leq 1.0$.

In an exemplary implementation mode, a position of the maximum refractive index in the electron transport layer is on the side of the electron transport layer close to the light emitting layer, and a position of the minimum refractive index in the electron transport layer is on the side of the electron transport layer away from the light emitting layer.

In an exemplary embodiment of the present disclosure, differences between the refractive indexes of the electron transport layer in the range of the red sub-pixels, the green sub-pixels, and the blue sub-pixels are small by setting the refractive index relationship of the electron transport layer at different wavelengths. With the same thickness, the difference of the electron transport layer affecting the microcavity effect is small, the influence of the electron transport layer on the light output efficiency of red, the light output efficiency of green light, and the light output efficiency of blue light can be relatively balanced. The three colors of red light, green light, and blue light can be simultaneously optimized, and an overall light output efficiency and light output quality can be improved to the utmost extent.

Table 4 and Table 5 show results of comparative experiments. In an comparative experiment, the organic light emitting layers of comparative structure 1 to comparative structure 3 are all HIL/HTL/EBL/EML/HBL/ETL/EIL. The materials and the thicknesses of the hole injection layers (HILs), the hole transport layers (HTLs), the electron block layers (EBLs), the light emitting layers (EMLs), the hole block layers (HBLs), and the hole injection layers (EILs) in the above-mentioned structures are the same. The thicknesses of the electron transport layers ETLs in the above-mentioned structures are the same.

Table 4 illustrates mixing situations of the electron transport layers in the comparative structures of an exemplary embodiment of the present disclosure. As shown in Table 4, in the electron transport layer of comparative structure 1, the proportion of the second host material in the electron transport layer is 100%. In a direction from the light emitting layer to the cathode, the refractive index in the electron transport layer is unchanged. In the electron transport layer of comparative structure 2, on one side close to the light emitting layer, the proportion of the first host material in the electron transport layer is 30%, and a proportion of the second host material in the electron transport layer is 70%. On one side away from the light emitting layer, the proportion of the second host material in the electron transport layer is 100%. In the electron transport layer of comparative structure 3, on one side close to the light emitting layer, the proportion of the first host material in the electron transport layer is 70%, and the proportion of the second host material in the electron transport layer is 30%. On one side far away from the light emitting layer, the proportion of the second host material in the electron transport layer is 100%.

TABLE 4

Electron transport layers in comparative structures

| | One side of electron transport layer close to light emitting layer | | One side of electron transport layer far away from light emitting layer | |
| --- | --- | --- | --- | --- |
| | First host material | Second host material | First host material | Second host material |
| Comparative structure 1 | 0 | 100% | 0 | 100% |
| Comparative structure 2 | 30% | 70% | 0 | 100% |
| Comparative structure 3 | 70% | 30% | 0 | 100% |

Figure 8:
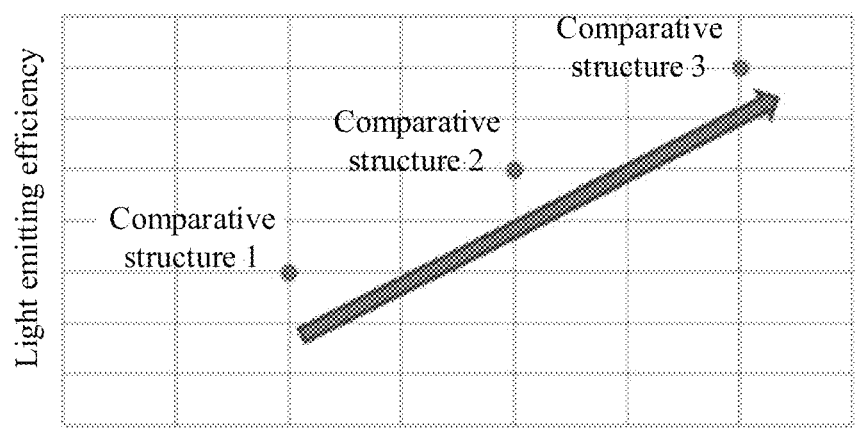
FIG. 8 illustrates comparison results of light output efficiency of comparative structures according to an exemplary embodiment of the present disclosure.

Table 5 shows comparison results of comparative structures of an exemplary embodiment of the present disclosure. FIG. 8 illustrates a comparison result for light output efficiencies of comparative structures of the exemplary embodiment of the present disclosure. The abscissa is a mixing ratio of the two materials and the ordinate is the light output efficiency. As shown in Table 5 and FIG. 8, compared with comparative structure 1, since one side of the electron transport layer close to the light emitting layer in comparative structure 2 and comparative structure 3 is mixed with the first host material with a high refractive index, the refractive index increases, and a film layer reflection effect between the electron transport layer and the light emitting layer is improved, which is conducive to giving full play to the light output characteristics of the light emitting device. Therefore, the light output efficiencies of the comparative structure 2 and the comparative structure 3 are improved. Compared with comparative structure 2, since the proportion of the first host material mixed on the side of the electron transport layer close to the light emitting layer in comparative structure 3 is higher than the proportion of the first host material mixed on the side of the electron transport layer close to the light emitting layer in comparative structure 2, the refractive index of the side of the electron transfer layer close to the light emitting layer in comparative structure 3 is greater than the refractive index of the side of the electron transport layer close to the light emitting layer in comparative structure 2, the film layer reflection effect between the electron transport layer and the light emitting layer is further improved. Therefore, the light output efficiency of comparative structure 3 is higher than the light output efficiency of comparative structure 2.

TABLE 5

Comparison results of light emitting efficiencies of comparative structures

| | Light output efficiency |
| --- | --- |
| Comparative structure 1 | 15.80% |
| Comparative structure 2 | 16.90% |
| Comparative structure 3 | 18.20% |

Figure 9A:
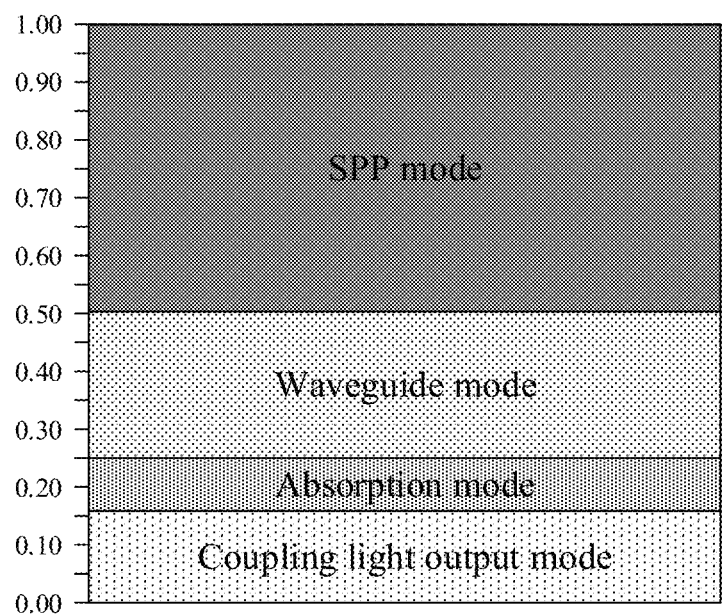
FIG. 9a to FIG. 9c illustrate stacked average contributions of a light emitting device according to an exemplary embodiment of the present disclosure.
Figure 9B:
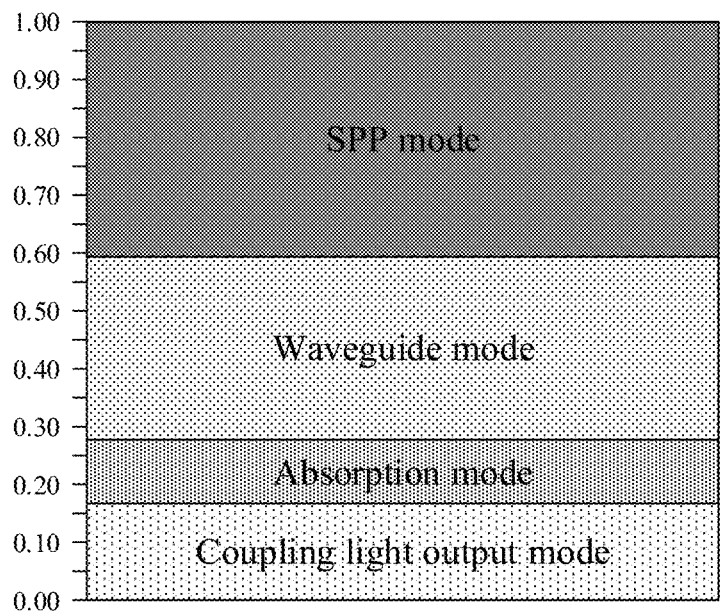
Figure 9C:
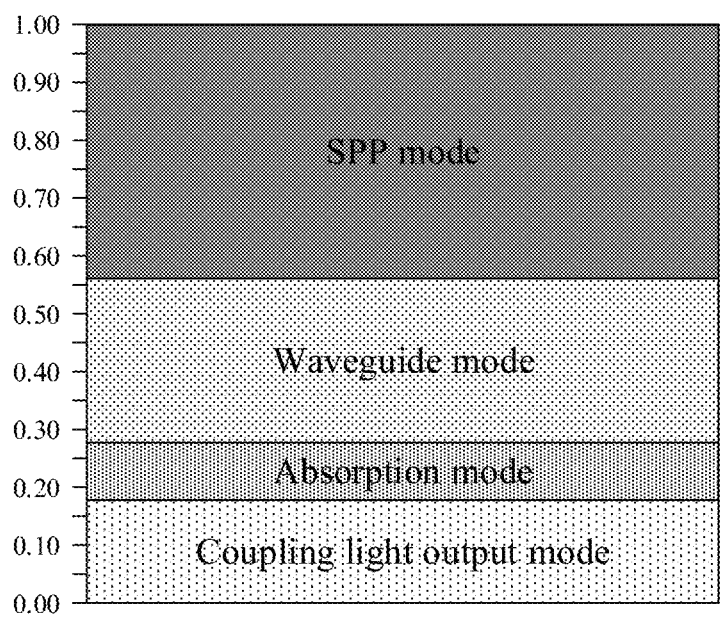

FIG. 9a to FIG. 9c illustrate stacked average contributions of a light emitting device of an exemplary embodiment of the present disclosure. According to Maxwell's equations and boundary conditions, 100% of total output light energy of the light emitting device can be decomposed into different forms of energy mode distributions. In general, an OLED light emitting device may include four energy mode distributions, respectively: an SPP mode, a waveguide mode, an absorption mode, and a coupling light output mode, wherein only the coupling light output mode has an effect on improving the efficiency of the light emitting device. Therefore, various optical structures are required to improve a proportion of the coupling light output mode in a design of the light emitting device and to suppress the proportion of other modes to some extent, so as to achieve the purpose of improving the efficiency of the light emitting device. FIG. 9a is a stacked average contribution of comparative structure 1, FIG. 9b is a stacked average contribution of comparative structure 2, and FIG. 9c is a stacked average contribution of comparative structure 3. The proportions of each mode from top to bottom are respectively: the SPP mode, the waveguide mode, the absorption mode, and the coupling light output mode. The ordinate represents relative average contribution.

As shown in FIG. 9a to FIG. 9c, compared with comparative structure 1, since the side of the electron transport layer close to the light emitting layer is mixed with the first host material with relatively high refractive index in comparative structure 2 and comparative structure 3, the refractive index is increased, and the film layer reflection effect between the electron transport layer and the light emitting layer is improved, which reduces the proportion of the SPP mode in comparative structure 2 and comparative structure 3, and increases the proportion of the waveguide mode. However, a decreasing degree of the proportion of the SPP mode is greater than an increasing degree of the waveguide mode. Therefore, the proportion of the coupling light output mode increases, and the efficiency of the light emitting device is improved. Compared with comparative structure 2, since the proportion of the first host material mixed on the side of the electron transport layer close to the light emitting layer in comparative structure 3 is higher than the proportion of the first host material mixed on the side of the electron transport layer close to the light emitting layer in comparative structure 2, the refractive index of the side of the electron transfer layer close to the light emitting layer in comparative structure 3 is greater than that of the side of the electron transport layer close to the light emitting layer in comparative structure 2, the film layer reflection effect between the electron transport layer and the light emitting layer is further improved, which increases the proportion of the SPP mode in comparative structure 3, and decreases the proportion of the waveguide mode. However, the decreasing degree of the proportion of the waveguide mode is greater than the increasing degree of the proportion of the SPP mode. Therefore, the proportion of the coupling light output mode of comparative structure 3 increases, and the efficiency of the light emitting device is further improved.

According to the exemplary embodiment of the present disclosure, a mixed structure of the first host material and the second host material is used for the electron transport layer, and the refractive index of the side of the electron transport layer close to the light emitting layer is greater than the refractive index of the side of the electron transport layer away from the light emitting layer, which makes the match of the refractive indexes as reasonable as possible in a multi-layer system, optimizes the optical performance of the light emitting device, effectively improves the coupling light output efficiency inside the light emitting device, correspondingly suppresses other unexpected mode effects, and is more beneficial to giving full play to the light output characteristics of the device.

The present disclosure further provides a method for preparing an organic light emitting device, which includes:
  forming an anode;
  forming a light emitting layer;
  forming an electron transport layer, wherein the electron transport layer includes a first host material and a second host material, a mixing ratio of the first host material to the second host material on one side of the electron transport layer close to the light emitting layer is different from a mixing ratio of the first host material to the second host material on one side of the electron transport layer away from the light emitting layer; and
  forming a cathode.

In an exemplary implementation mode, forming the electron transport layer includes that: a manner of performing co-evaporation on the first host material and the second host material is used. In a process from the beginning of evaporation to the end of the evaporation, an evaporation rate of the first host material is controlled to be gradually decreased, and an evaporation rate of the second host material is controlled to be gradually increased, so that a mass percentage of the first host material in the electron transport layer gradually decreases and a mass percentage of the second host material in the electron transport layer gradually increases in a direction from a position close to the light emitting layer to a position away from the light emitting layer.

In an exemplary implementation mode, at the beginning of the evaporation, the evaporation rate of the first host material is controlled to be 6 Å/s to 8 Å/s, and the evaporation rate of the second host material is controlled to be 2 Å/s to 4 Å/s. At the end of the evaporation, the evaporation rate of the first host material is controlled to be 0 Å/s to 1 Å/s, and the evaporation rate of the second host material is controlled to be 9 Å/s to 10 Å/s, so that on the side close to the light emitting layer, the mass percentage of the first host material in the electron transfer layer is 60% to 80%, and the mass percentage of the second host material in the electron transfer layer is 20% to 40%. On the side away from the light emitting layer, the mass percentage of the first host material in the electron transfer layer is about 0% to 10%, and the mass percentage of the second host material in the electron transfer layer is about 90% to 100%.

The present disclosure further provides a display apparatus, including the foregoing organic light emitting device. The display apparatus may be any product or part with a display function, such as a mobile phone, a tablet computer, a television, a display, a laptop computer, a digital photo frame, a navigator, a vehicle-mounted display, a smart watch, and a smart bracelet.

Although the implementation modes disclosed by the present disclosure are stated above, the contents are only the implementation modes used for the convenience of understanding the present disclosure and are not used to limit the present disclosure. Any person skilled in the art of the present disclosure can make any modification and change in the forms and details of implementation without departing from the spirit and scope disclosed in the present disclosure. However, the scope of protection of the patent of the present disclosure shall still be subject to the scope defined in the appended claims.

The invention claimed is:

1. An organic light emitting device, comprising an anode, a cathode, and a light emitting layer and an electron transport layer arranged between the anode and the cathode, wherein the electron transport layer is arranged between the light emitting layer and the cathode; the electron transport layer comprises a first host material and a second host material; and a mixing ratio of the first host material to the second host material of one side of the electron transport layer close to the light emitting layer is different from a mixing ratio of the first host material to the second host material of one side of the electron transport layer away from the light emitting layer; and
  wherein a refractive index of the first host material is greater than a refractive index of the second host material.

2. The organic light emitting device of claim 1, wherein in a direction from a position close to the light emitting layer to a position away from the light emitting layer, a mass percentage of the first host material in the electron transport layer gradually decreases, and a mass percentage of the second host material in the electron transport layer gradually increases.

3. The organic light emitting device of claim 2, wherein on the side of the electron transport layer close to the light emitting layer, the mass percentage of the first host material in the electron transport layer is 60% to 80%, and the mass percentage of the second host material in the electron transport layer is 20% to 40%.

4. The organic light emitting device of claim 2, wherein on the side of the electron transport layer away from the light emitting layer, the mass percentage of the first host material in the electron transport layer is 0% to 10%, and the mass percentage of the second host material in the electron transport layer is 90% to 100%.

5. The organic light emitting device of claim 1, wherein a thickness of the light emitting layer is 10 nm to 25 nm, a thickness of the electron transport layer is 20 nm to 50 nm, and on one side of the electron transport layer close to the light emitting layer, a refractive index of the electron transport layer is 1.80 to 2.00.

6. The organic light emitting device of claim 1, wherein a thickness of the electron transport layer is 20 nm to 50 nm, a thickness of the cathode is 10 nm to 20 nm, and on one side of the electron transport layer close to the cathode, a refractive index of the electron transport layer is 1.55 to 1.70.

7. The organic light emitting device of claim 1, wherein a hole injection layer, a hole transport layer, and an electron block layer are further arranged between the anode and the light emitting layer, a hole block layer is further arranged between the light emitting layer and the electron transport layer, an electron injection layer is further arranged between the electron transport layer and the cathode, wherein a thickness of the hole injection layer is 5 nm to 20 nm, a thickness of the hole transport layer is 100 nm to 150 nm, a thickness of the electron block layer is 5 nm to 20 nm, a thickness of the light emitting layer is 10 nm to 25 nm, a thickness of the hole block layer is 5 nm to 15 nm, a thickness of the electron injection layer is 0.5 nm to 2 nm, on one side of the electron transport layer close to the hole block layer, a refractive index of the electron transport layer is 1.80 to 2.00, and on one side of the electron transport layer close to the electron injection layer, the refractive index of the electron transport layer is 1.55 to 1.70.

8. The organic light emitting device of claim 1, wherein the electron transport layer has a maximum red light refractive index $n_{RMAX}$ within a wavelength range of 600 nm to 640 nm, has a maximum green light refractive index $n_{GMAX}$ within a wavelength range of 510 nm to 550 nm, and has a maximum blue light refractive index $n_{BMAX}$ within a wavelength range of 440 nm to 480 nm, and the electron transport layer satisfies:

$$|n_{BMAX}-n_{GMAX}| \leq 0.4, |n_{BMAX}-n_{RMAX}| \leq 0.8.$$

9. The organic light emitting device of claim 8, wherein the maximum red light refractive index $n_{RMAX}$ is 1.81 to 1.91, the maximum green light refractive index $n_{GMAX}$ is 1.86 to 1.96, and the maximum blue light refractive index $n_{BMAX}$ is 1.90 to 2.00.

10. The organic light emitting device of claim 1, wherein the electron transport layer has a minimum red light refractive index $n_{RMIN}$ within a wavelength range of 600 nm to 640 nm, has a minimum green light refractive index $n_{GMIN}$ within a wavelength range of 510 nm to 550 nm, and has a minimum blue light refractive index $n_{BMIN}$ within a wavelength range of 440 nm to 480 nm, and the electron transport layer satisfies:

$$|n_{BMIN}-n_{GMIN}| \leq 0.5, |n_{BMIN}-n_{RMIN}| \leq 1.0.$$

11. The organic light emitting device of claim 10, wherein the minimum red light refractive index $n_{RMIN}$ is 1.55 to 1.65, the maximum green light refractive index $n_{GMIN}$ is 1.57 to 1.67, and the maximum blue light refractive index $n_{BMIN}$ is 1.60 to 1.70.

12. A display apparatus, comprising the organic light emitting device of claim 1.

13. A method for preparing the organic light emitting device according to claim 1, comprising:
    forming the anode;
    forming the light emitting layer;
    forming the electron transport layer; and
    forming the cathode.

14. The method of claim 13, wherein forming the electron transport layer comprises: using a manner of performing co-evaporation on the first host material and the second host material, in a process from beginning of evaporation to end of the evaporation, controlling the evaporation rate of the first host material to gradually decrease, and controlling the evaporation rate of the second host material to gradually increase, so that a mass percentage of the first host material in the electron transport layer gradually decreases and a mass percentage of the second host material in the electron transport layer gradually increases in a direction from a position close to the light emitting layer to a position away from the light emitting layer.

15. The method of claim 14, wherein at the beginning of the evaporation, the evaporation rate of the first host material is controlled to be 6Å/s to 8Å/s, and the evaporation rate of the second host material is controlled to be 2Å/s to 4Å/s, and at the end of the evaporation, the evaporation rate of the first host material is controlled to be 0Å/s to 1Å/s, and the evaporation rate of the second host material is controlled to be 9Å/s to 10Å/s.

16. The organic light emitting device of claim 2, wherein the electron transport layer has a maximum red light refractive index $n_{RMAX}$ within a wavelength range of 600 nm to 640 nm, has a maximum green light refractive index $n_{GMAX}$ within a wavelength range of 510 nm to 550 nm, and has a maximum blue light refractive index $n_{BMAX}$ within a wavelength range of 440 nm to 480 nm, and the electron transport layer satisfies:

$$|n_{BMAX}-n_{GMAX}| \leq 0.4, |n_{BMAX}-n_{RMAX}| \leq 0.8.$$

17. The organic light emitting device of claim 3, wherein the electron transport layer has a maximum red light refractive index $n_{RMAX}$ within a wavelength range of 600 nm to 640 nm, has a maximum green light refractive index $n_{GMAX}$ within a wavelength range of 510 nm to 550 nm, and has a maximum blue light refractive index $n_{BMAX}$ within a wavelength range of 440 nm to 480 nm, and the electron transport layer satisfies:

$$|n_{BMAX}-n_{GMAX}| \leq 0.4, |n_{BMAX}-n_{RMAX}| \leq 0.8.$$

18. The organic light emitting device of claim 4, wherein the electron transport layer has a maximum red light refractive index $n_{RMAX}$ within a wavelength range of 600 nm to 640 nm, has a maximum green light refractive index $n_{GMAX}$ within a wavelength range of 510 nm to 550 nm, and has a maximum blue light refractive index $n_{BMAX}$ within a wavelength range of 440 nm to 480 nm, and the electron transport layer satisfies:

$$|n_{BMAX}-n_{GMAX}| \leq 0.4, |n_{BMAX}-n_{RMAX}| \leq 0.8.$$

* * * * *